United States Patent
Ngo et al.

(10) Patent No.: US 7,459,950 B2
(45) Date of Patent: Dec. 2, 2008

(54) PULSED LOCAL CLOCK BUFFER (LCB) CHARACTERIZATION RING OSCILLATOR

(75) Inventors: Hung C. Ngo, Austin, TX (US); Jente B. Kuang, Austin, TX (US); James D. Warnock, Somers, NY (US); Dieter F. Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 11/553,014

(22) Filed: Oct. 26, 2006

(65) Prior Publication Data
US 2008/0100360 A1 May 1, 2008

(51) Int. Cl.
*H03K 3/017* (2006.01)
(52) U.S. Cl. .................. 327/172; 327/175; 327/191
(58) Field of Classification Search ......... 327/172–176, 327/137, 155, 159, 160, 191, 295; 365/189.05, 365/230.03, 230.06, 230.08
See application file for complete search history.

(56) References Cited

U.S. PATENT DOCUMENTS 6,107,850 A * 8/2000 Shimizu .................. 327/172
6,215,720 B1 * 4/2001 Amano et al. .......... 365/230.03

* cited by examiner

*Primary Examiner*—An T Luu
(74) *Attorney, Agent, or Firm*—Cantor Colburn LLP; Cas Salys

(57) ABSTRACT

In an exemplary embodiment of the present invention, a local clock buffer (LCB) fabricated in a semiconductor receives a global clock signal as input. The LCB implements a pulse width controller that is operationally coupled to the LCB and an output driver forming a ring oscillator. The output driver outputs a pulse width adjusted signal. The pulse width of the pulse width adjusted signal is adjustable by way of the pulse width controller and is related in frequency to the global clock signal. A second ring oscillator (also referred to as the nclk loop) can also be implemented to server as the global clock signal. The pulse width controller can be used to precisely adjust the pulse width of the pulse width adjusted signal. A pulse width multiplier can be implemented to allow direct observation and measurement of the pulse width of the pulse width adjusted signal.

6 Claims, 10 Drawing Sheets

2000

4000

PULSED LOCAL CLOCK BUFFER (LCB) CHARACTERIZATION RING OSCILLATOR

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to a local clock buffer (LCB) fabricated in a semiconductor. The LCB receives a global clock signal as input and implements a pulse width controller that is operationally coupled to the LCB and an output driver forming a ring oscillator. The output driver outputs a pulse width adjusted signal. The pulse width of the pulse width adjusted signal is adjustable by way of the pulse width controller and is related in frequency to the global clock signal. A second ring oscillator (also referred to as the nclk loop) can also be implemented to serve as the global clock signal. The pulse width controller can be used to precisely adjust the pulse width of the pulse width adjusted signal. A pulse width multiplier can be implemented to allow direct observation and measurement of the pulse width of the pulse width adjusted signal.

2. Description of Background

Before our invention local clock buffers (LCB) were used in semiconductor design to distribute a global clock signal to the many functional blocks, which comprise the semiconductor.

In high-speed designs it can be very important to characterize pulsed clocking to insure correct operation of the circuit. As such, current high-speed design test methods at LCB boundaries do not directly correlate with pulse width. In addition, pulse clocks can be more sensitive to logic failures and latch point failures can be caused by many more variables then just the pulse width.

As such, it is often difficult to separate these variables, and in particular to isolate, test, and use the LCB output signal pulse width as a way in which to characterize LCB performance. In addition, there are no ways in which to adjust or tune the LCB output signal pulse width.

SUMMARY OF THE INVENTION

The shortcomings of the prior art are overcome and additional advantages are provided through the provision of a method of pulse width adjusting a local clock buffer (LCB), the method comprising fabricating a local clock buffer in a semiconductor; receiving a global clock signal as input to the local clock buffer; implementing a pulse width controller operationally coupled to the local clock buffer and an output driver forming a ring oscillator, said output driver outputs a pulse width adjusted signal; and adjusting the pulse width controller to change the pulse width of the pulse width adjusted signal, the pulse width adjusted signal is related in frequency to the global clock signal.

Also, shortcomings of the prior art are overcome and additional advantages are provided through the provision of a pulse width adjustable local clock buffer (LCB) circuit fabricated in a semiconductor, the pulse width adjustable local clock buffer circuit comprising a base block circuit, the base block circuit having a global clock signal input; a clock control circuit, the clock control circuit having a clock control input and a global clock input; an output driver circuit, the output driver is operationally coupled to the base block circuit, the output driver circuit having a pulse width adjusted signal output; and a pulse width controller circuit, the pulse width controller circuit is operationally coupled to the base block circuit and the output driver circuit forming a ring oscillator; wherein the pulse width of the pulse width adjusted signal is adjustable by way of the pulse width controller circuit and is related in frequency to the global clock signal.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which implements a pulse width adjustable local clock buffer (LCB) circuit.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
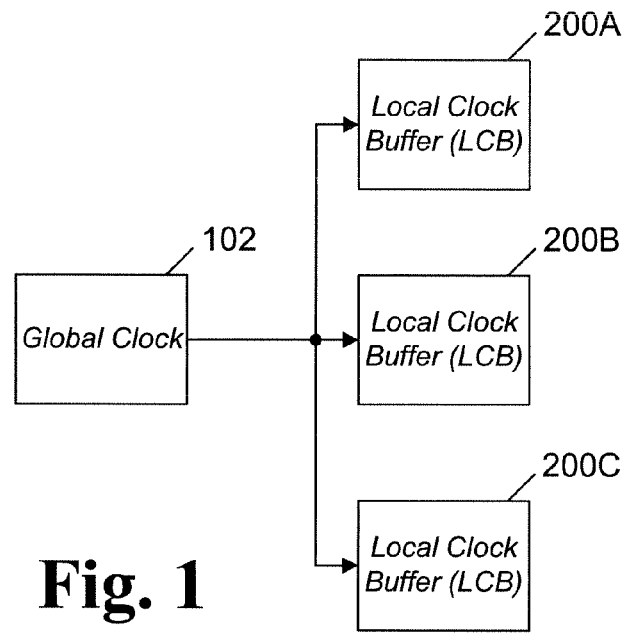
FIG. 1 illustrates one example of a global clock being distributed to a plurality of local clock buffers (LCB)

Turning now to the drawings in greater detail, it will be seen that in FIG. 1 there is illustrated one example of a global clock signal 102 being distributed in a semiconductor to a plurality of local clock buffers (LCB) 200A-200C. A plurality of local clock buffers 200A-200C can be referred to as LCB 200.

In an exemplary embodiment in the fabrication of a semiconductor a functional portion of the semiconductor will generate a global clock signal 102. In this regard, the global clock signal 102 is distributed to and used by other functional blocks within the semiconductor. These other functional blocks typically receive the global clock signal 102 by way of a plurality of local clock buffers (LCB), 200A-200C. In operation these local clock buffers 200A-200C the global clock signal 102 and output the signal (or some related derivative of the global clock signal 102) for use by the functional blocks within the semiconductor or accessible external to the semiconductor by other circuitry.

Such global clock signal 102 in high-speed designs, because of the high frequency, can be difficult to observe and even harder to characterize. In operation the speed of the global clock signal 102 can be such that traditional test and observation equipment are not fast enough and or sensitive enough to directly observe the global clock signal 102, or the pulse width associated with the global clock signal 102. This can also make characterizing the LCB 200 difficult.

In addition, in an exemplary embodiment for correct operation of the local clock buffer 200 and the functional circuitry operationally connect to the local clock buffer 200 the pulse width of the output signal from the local clock buffer 200 needs to be accurately characterized. In this regard, for example and not limitation, a pulse width that is too short can cause the local clock buffer 200 to fail. As such, if the pulse width causes the LCB 200 to fail, the functional circuitry operationally coupled to the LCB 200 will not work correctly. In addition, if the functional circuitry requires and does not receive a precisely tuned pulse width output from LCB 200 the functional circuitry may not operate correctly.

Figure 2:
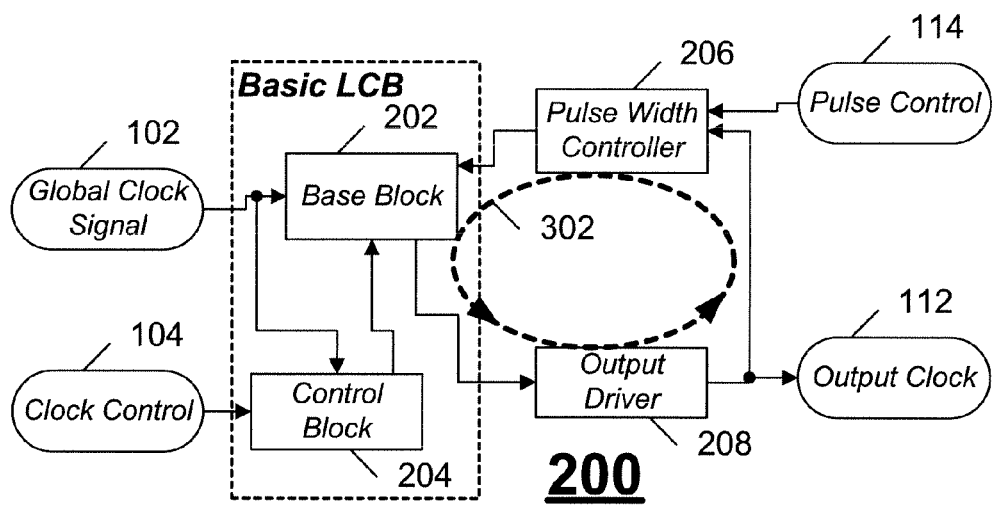
FIG. 2 illustrates one example of a system diagram of a local clock buffer (LCB) with a pulse width controller added forming a ring oscillator.

Referring to FIG. 2 there is illustrated one example of a system diagram of a local clock buffer (LCB) 200 with a pulse width controller 206 added forming a ring oscillator. In an exemplary embodiment the pulse width of the output clock 112 needs to be characterized to insure correct operation of the LCB 200 and of the functional circuitry operationally connected to the LCB 200. FIG. 2 illustrates one example of a LCB 200 having a base block 202 and a control block 204 operationally related and receiving a global clock signal 102. In addition, control block 204 has an input for receiving a clock control signal 104. In addition to the basic LCB 200 base block 202 and control block 204 a pulse width controller 206 and a driver 208 are operationally coupled to the basic LCB and form a ring oscillator. The ring oscillator is generally shown as ring oscillator 302 to better identify the functionality of certain portions of the circuit.

In operation the basic LCB 200 the global clock signal 102. The ring oscillator 302 formed by the basic LCB, pulse width controller 206, and output driver 208 cooperate with pulse control 114 to allow the pulse width of output clock 112 to be adjusted. The output clock 112 produces a pulse width adjusted signal that is related to the global clock signal 102. Output clock 112 can also be referred to as a pulse width adjusted signal. As such, the output clock can be the same frequency as the global clock signal 102 or be greater than, or less than a fixed multiple of the global clock signal 102.

In this regard, a pulse width adjusted signal from output clock 112 generated by the LCB 200 allows several performance enhancing features to be effectuated. First the pulse width of the LCB 200 output clock 112 can be utilized to characterize the operational performance of the LCB 200. As an example and not limitation, the longest pulse width and short pulse width of the pulse width adjusted signal from output clock 112 can be tested and determined by adjusting the pulse width controller 206. As such, the shortest pulse width in which the LCB 200 operates correctly can be determined. From these measurements the LCB 200 can be characterized and or other operational performance factors can be determined.

Another advantage in an exemplary embodiment is that pulse width controller 206 can be utilized to precisely tune the LCB 200 pulse width adjusted signal output from output clock 112. In this regard, if a specific pulse width is required for correct operation of the LCB 200 and or functional blocks operationally related to the LCB 200 the pulse width control 206 can be adjusted to precisely produce the desired pulse width of the pulse width adjusted signal output from output clock 112.

Figure 3:
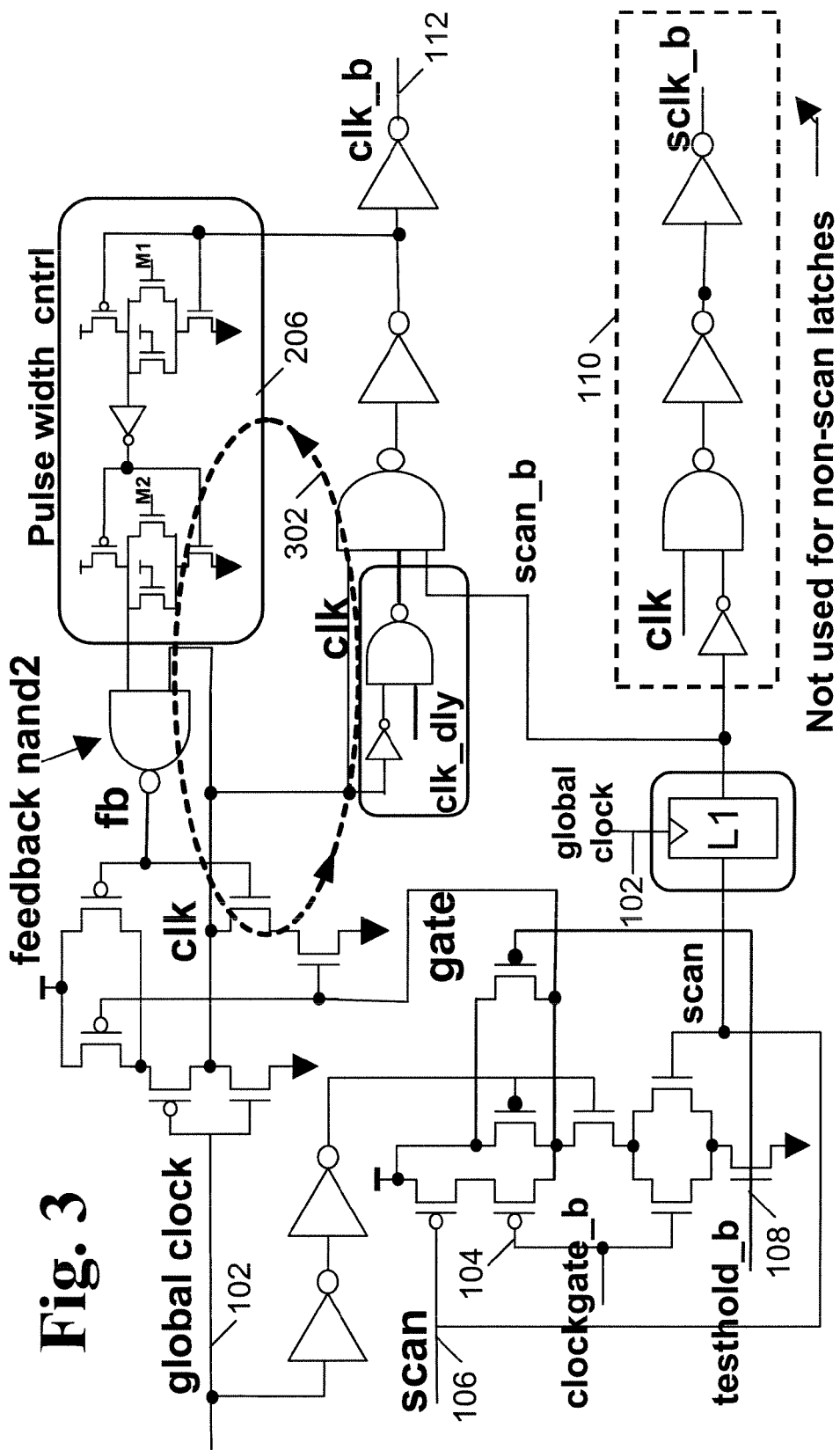
FIG. 3 illustrates one example of a schematic diagram of a local clock buffer (LCB) with a pulse width controller added forming a ring oscillator.

Referring to FIG. 3 there is illustrated as one example of a schematic diagram of a local clock buffer (LCB) with pulse width controller 206 added forming a ring oscillator. Shown in FIG. 3 is global clock signal 102 input, clockgate_b which corresponds to the clock control 104, a scan input 106, a testhold_b signal 108, and clock_b which corresponds to the pulse width adjusted signal output from output clock 112. In an exemplary embodiment for example and not limitation, FIG. 3 can be referred to as a pulse LCB for pulsed latches.

Figure 4:
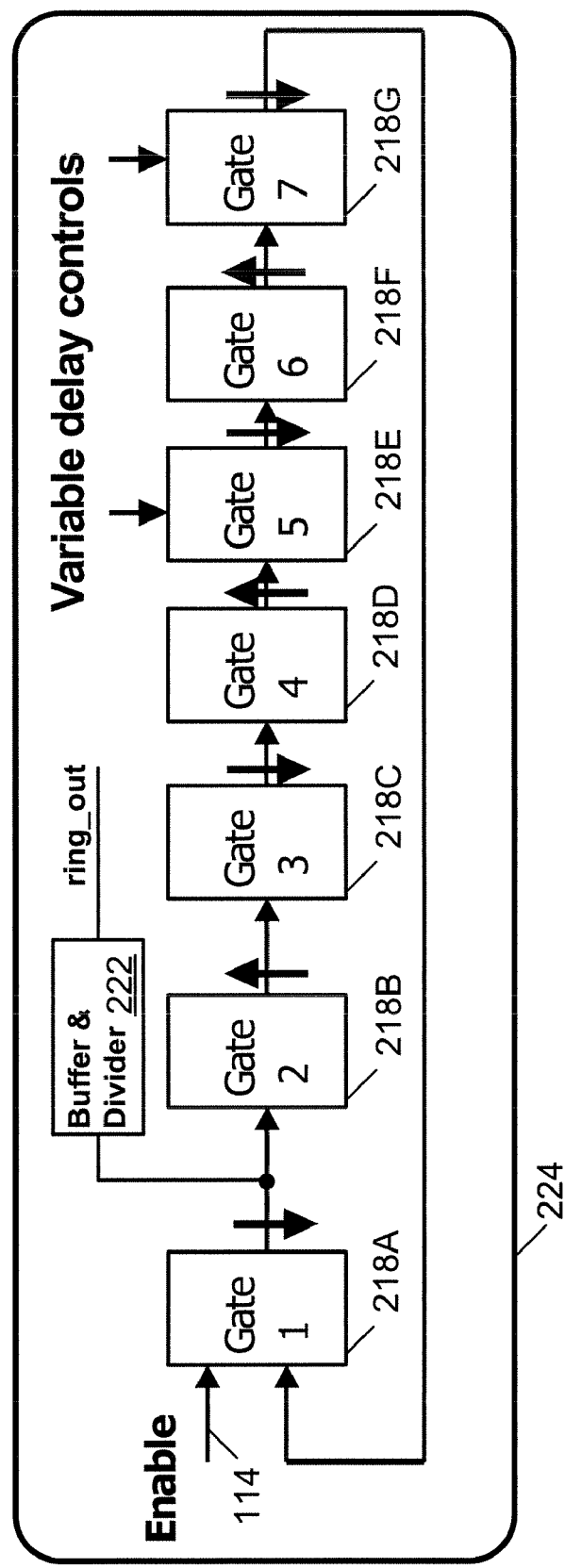
FIG. 4 illustrates one example of a ring oscillator implemented with a plurality of gates.

Referring to FIG. 4 there is illustrated a ring oscillator 224 implemented with a plurality of gates. In an exemplary embodiment, a ring oscillator 224 can be implemented by interconnecting a plurality of gates 218A-218G and a buffer divider 222 having a ring_out signal. Operation of the pulse width controller can be determined by enable 114, which corresponds to pulse control 114.

Figure 5:
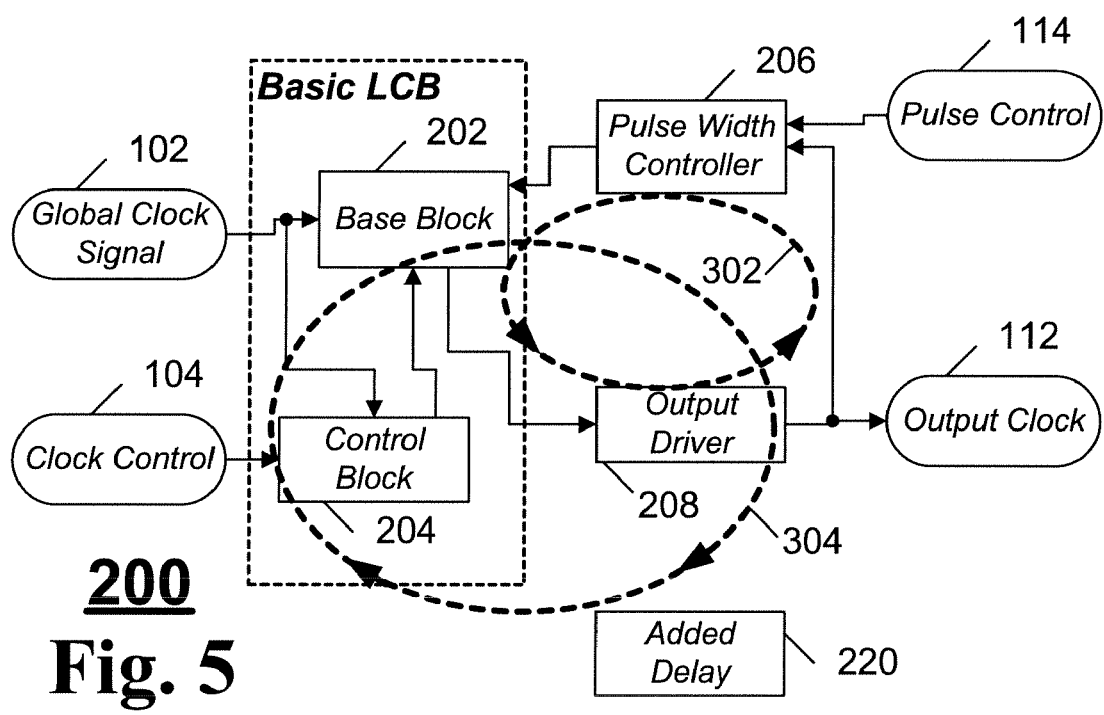
FIG. 5 illustrates one example of a system diagram of a local clock buffer (LCB) with a pulse width controller added forming a first ring oscillator and an added delay added forming a second ring oscillator.

Referring to FIG. 5 there is illustrated a local clock buffer (LCB) 200 with pulse width controller 206 added forming a first ring oscillator and an added delay 220 added forming a second ring oscillator. In an exemplary embodiment, it can be difficult to work with a global clock signal 102 that is produced by a separate functional block. In this regard, the global clock signal 102 frequency may not be adjustable and or may not be settable to the desired frequency. As such, tuning of the LCB 200 and characterizing LCB 200 operation through test and measurements may be more easily accomplished if the global clock signal was settable and or adjustable.

In this exemplary embodiment a second ring oscillator 304 can be realized by the addition of added delay 220. In this regard, output driver 208, control block 204, and added delay 220 operationally form a second ring oscillator. The second ring oscillator is generally shown as second ring oscillator 304 to better identify the functionality of certain portions of the circuit.

In operation the added delay 220 can be adjusted causing the output frequency of the second ring oscillator 304 to change. The output frequency of the second ring oscillator 304 is then used as the global clock signal 102. In this regard the LCB 200 with first and second ring oscillators no longer requires a global clock signal generated by a different functional block in the semiconductor.

In an exemplary embodiment, the frequency of the second ring oscillator and as such the self generating global clock signal can be adjusted in frequency by adjusting the added delay 220, and the pulse width adjusted signal output from output clock 112 can be adjusted by adjusting the pulse width controller 206. As such, both the frequency and pulse width of the pulse width adjusted signal output from output clock 112 can be adjusted to test, measure, characterize, and or otherwise operate the LCB 200 without the need for a global clock signal produced by another functional block in the semiconductor.

Figure 6:
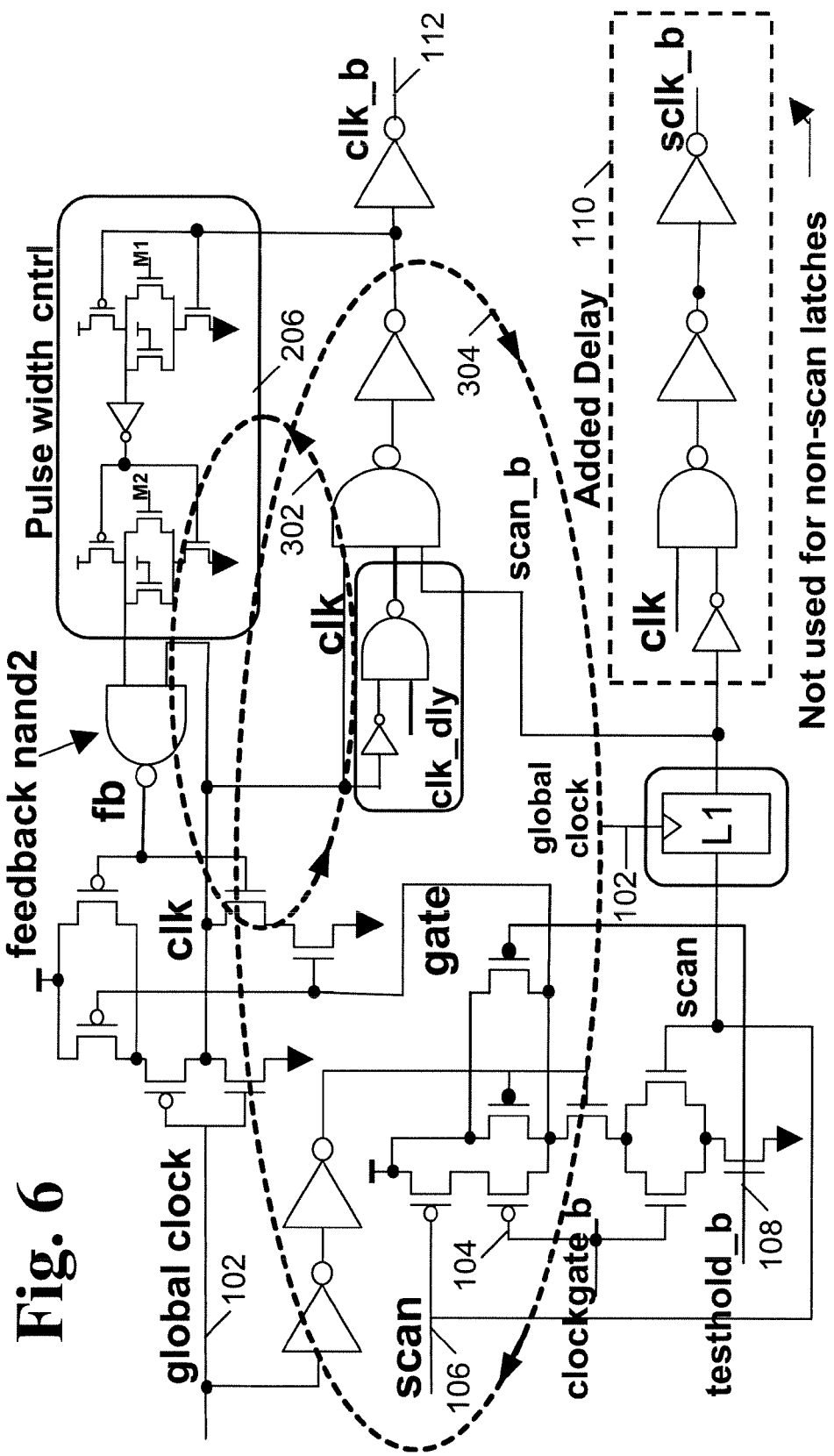
FIG. 6 illustrates one example of a schematic diagram of a local clock buffer (LCB) with a pulse width controller added forming a first ring oscillator and an added delay added forming a second ring oscillator.

Referring to FIG. 6 there is illustrated a schematic diagram of a local clock buffer (LCB) 200 with pulse width controller 206 added forming a first ring oscillator 302 and an added delay 110 added forming a second ring oscillator 304. Shown in FIG. 6 is global clock signal 102 input, clockgate_b which corresponds to the clock control 104, a scan input 106, a testhold_b signal 108, and clock_b which corresponds to the pulse width adjusted signal output from output clock 112.

Another advantage of an exemplary embodiment of the present invention is that the pulse width of the pulse width adjusted signal output from output clock 112 can be directly measured by implementing the pulse width multiplier. In this regard, one example is illustrated in FIG. 7.

The speed of the global clock signal 102 is typically so fast that traditional test and measurement equipment may not adequately capture and measure the particulars of the global clock signal 102 waveform. As such, prior art methods of trying to observe the pulse width of such high-speed signals typically involved a relative measurement. Such relative measurement was done by taking a frequency 'A' and a frequency 'B', subtracting 'B' from 'A' and dividing by the number of divisions required to take the output.

In contrast an embodiment of the present invention utilizes a pulse width multiplier, which allows the pulse width to be multiplied by a series of gates such that the pulse width can be directly measured.

Figure 7:
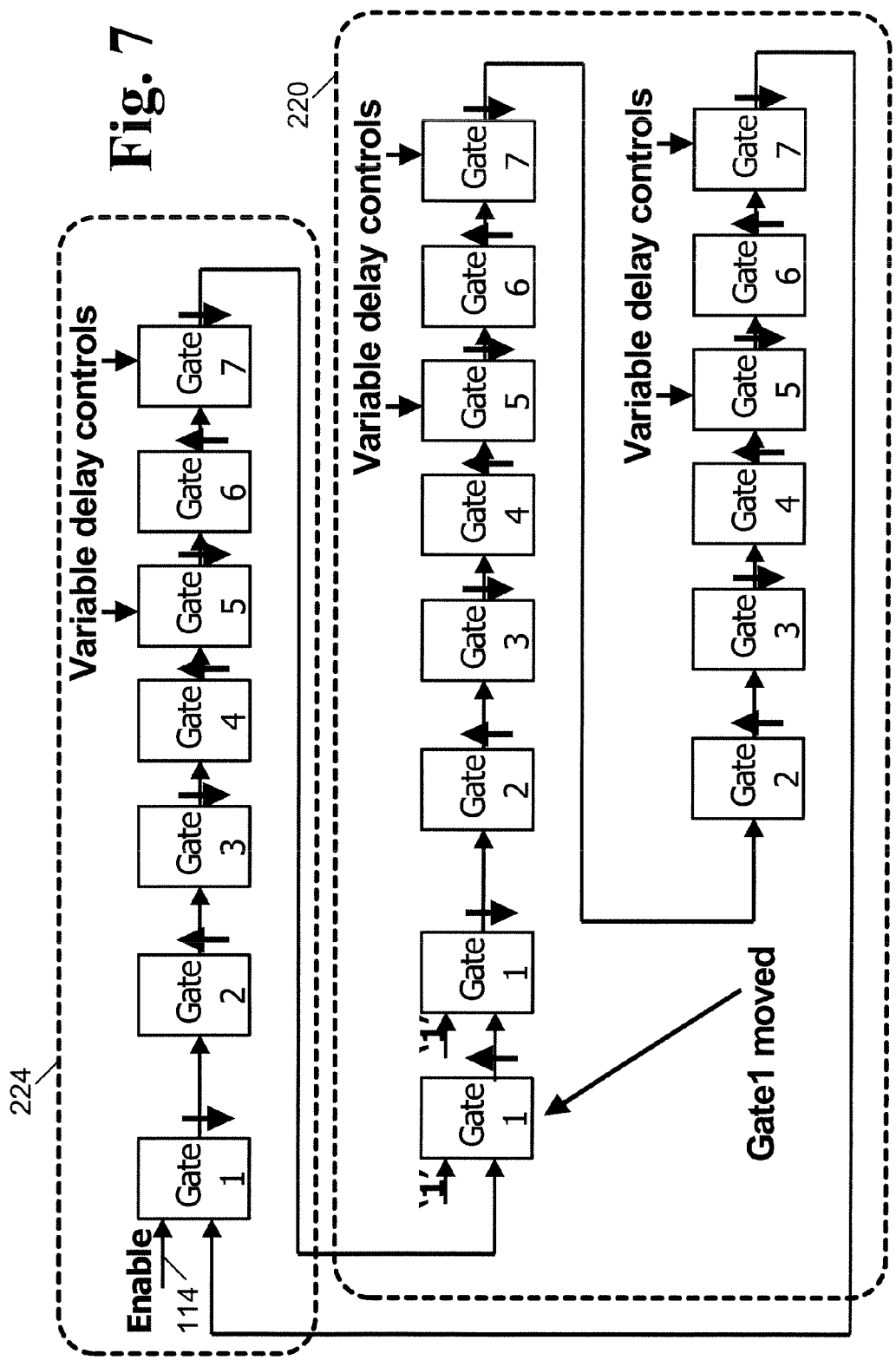
FIG. 7 illustrates one example of a pulse width controller with a pulse width multiplier added.

Referring to FIG. 7 there is illustrated one example of a ring oscillator 224 with a pulse width multiplier 220 added. In an exemplary embodiment, the pulse width multiplier 220 can be implemented by cascading a plurality of gates as illustrated in FIG. 7.

Figure 8:
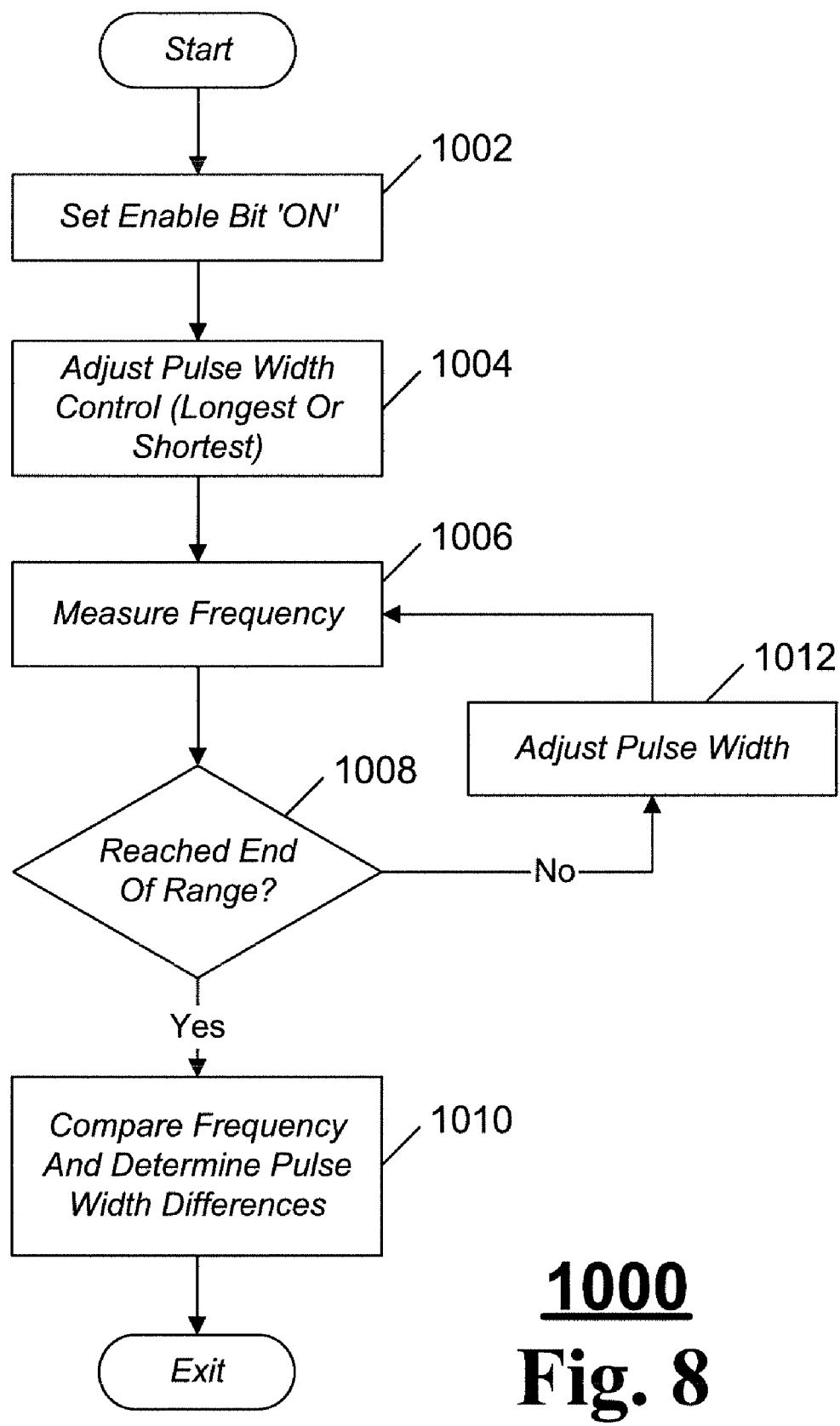
FIG. 8. illustrates one example of a routine 1000 for determining local clock buffer characteristics by implementing a ring oscillator.

Referring to FIG. 8 there is illustrated a routine 1000 for determining local clock buffer (LCB) 200 characteristics by implementing a ring oscillator 302. In an exemplary embodiment a LCB 200 can be fabricated in a semiconductor. The LCB 200 can receive a global clock signal 102 or be self clocked by implementing a second ring oscillator 304. A pulse width controller 206 can then be utilized to adjust the pulse width of a pulse width adjusted signal output from clock output 112. The LCB 200 can then be tested, measured, and or otherwise characterized by determining among other things the shortest pulse width before the LCB 200 fails. Processing begins in block 1002.

In block 1002 an enable bit is set 'ON' allowing the circuit to operate. In an exemplary embodiment, a global clock signal 102 is established. The global clock signal 102 can originate from a functional block in the semiconductor, and or be self generated by implementing a second ring oscillator 304. The global clock signal 102 servers as the input clock to the LCB 200. Processing then moves to block 1004.

In block 1004 the pulse with of the pulse width adjusted signal output from clock out 112 is adjusted by adjusting the pulse width controller 206. Such adjustment to the pulse width controller 206 includes increasing and or decreasing the pulse width of the pulse width adjusted signal output from clock output 112 to a longest or shortest setting. Processing then moves to block 1006.

In block 1006 the frequency is measured. Processing then moves to decision block 1008.

In decision block 1008 a determination is made as to whether or not the end of range has been reached. If the resultant is in the affirmative that is the end of range has been reached then processing moves to block 1010. If the resultant is in the negative that is the end of range has not been reached then processing moves to block 1012.

In block 1010 the frequencies, pulse width differences are determined, and or other LCB 200 characteristics are determined. The routine is then exited.

In block 1012 the pulse width is adjusted and processing moves back to block 1006.

Figure 9:
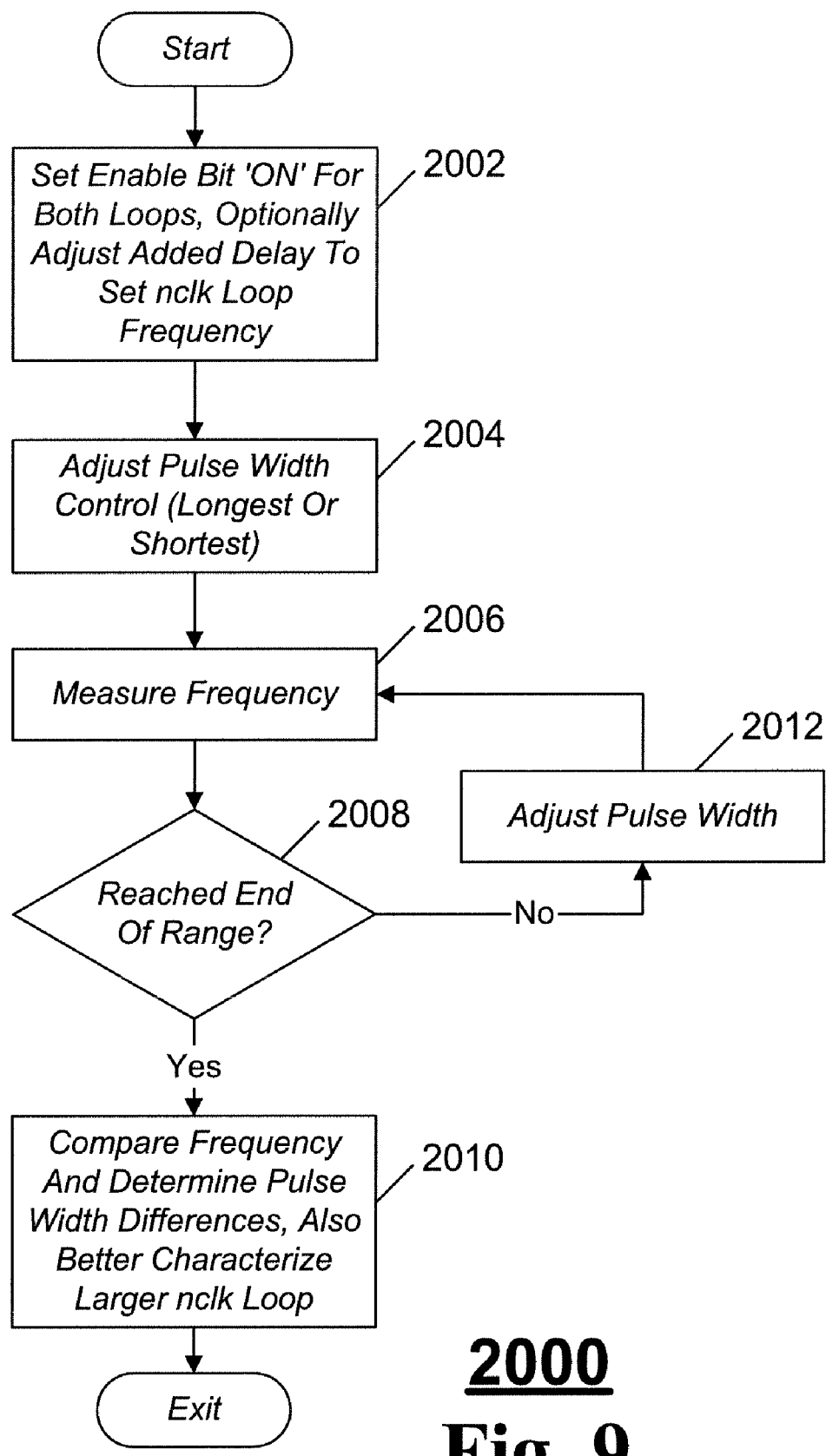
FIG. 9. illustrates one example of a routine 2000 for determining local clock buffer characteristics by implementing two ring oscillators.

Referring to FIG. 9 there is illustrated one example of a routine 2000 for determining local clock buffer (LCB) 200 characteristics by implementing two ring oscillators. In an exemplary embodiment it can be difficult to work with a global clock signal 102 that is produced by a separate functional block. In this regard, the global clock signal 102 frequency may not be adjustable and or may not be settable to the desired frequency. As such, tuning of the LCB 200 and characterizing LCB 200 operation through test and measurements may be more easily accomplished if the global clock signal was settable and or adjustable.

In this exemplary embodiment a second ring oscillator 304 can be realized by the addition of added delay 220. In this regard, output driver 208, control block 204, and added delay 220 operationally form a second ring oscillator. The second ring oscillator is generally shown in FIGS. 5 and 6 as second ring oscillator 304 to better identify the functionality of certain portions of the circuit.

In operation the added delay 220 can be adjusted causing the output frequency of the second ring oscillator 304 to change. The output frequency of the second ring oscillator 304 is then used as the global clock signal 102. In this regard the LCB 200 with first and second ring oscillators no longer requires a global clock signal generated by a different functional block in the semiconductor.

In an exemplary embodiment the frequency of the second ring oscillator 304 and as such the self generating global clock signal can be adjusted in frequency by adjusting the added delay 220, and the pulse width adjusted signal output from output clock 112 can be adjusted by adjusting the pulse width controller 206. As such, both the frequency and pulse width of the pulse width adjusted signal output from output clock 112 can be adjusted to test, measure, characterize, and or otherwise operate the LCB 200 without the need for a global clock signal produced by another functional block in the semiconductor.

As such, Routine 2000 illustrates one example of determining local clock buffer characteristics by implementing two ring oscillators. In an exemplary embodiment a LCB 200 can be fabricated in a semiconductor. The LCB 200 can receive a global clock signal 102 by implementing a second ring oscillator 304. A pulse width controller 206 can then be utilized to adjust the pulse width of a pulse width adjusted signal from clock output 112. The LCB 200 can then be tested, measured, and or otherwise characterized by determining among other things the shortest pulse width before the LCB 200 fails. Processing begins in block 2002.

In block 2002 an enable bit is set 'ON' allowing both ring oscillator circuits to operate. In addition, if desired added delay 220 can be adjusted to change the nclk loop frequency. The nclk loop frequency is also referred to as the second ring oscillator 304 frequency. The desired nclk loop frequency (second ring oscillator 304 frequency) is selected and processing then moves to block 2004.

In block 2004 the pulse with of the pulse width adjusted signal output from clock out 112 is adjusted by adjusting the pulse width controller 206. Such adjustment to the pulse width controller 206 includes increasing and or decreasing the pulse width of the pulse width adjusted signal output from clock output 112 to a longest or shortest setting. Processing then moves to block 2006.

In block 2006 the frequency is measured. Processing then moves to decision block 2008.

In decision block 2008 a determination is made as to whether or not the end of range has been reached. If the resultant is in the affirmative that is the end of range has been reached then processing moves to block 2010. If the resultant is in the negative that is the end of range has not been reached then processing moves to block 2012.

In block 2010 the frequencies, pulse width differences are determined, and or other LCB 200 characteristics are determined. Processing then moves to block 2012.

In block 2012 the pulse width is adjusted and processing moves back to block 2006.

Figure 10:
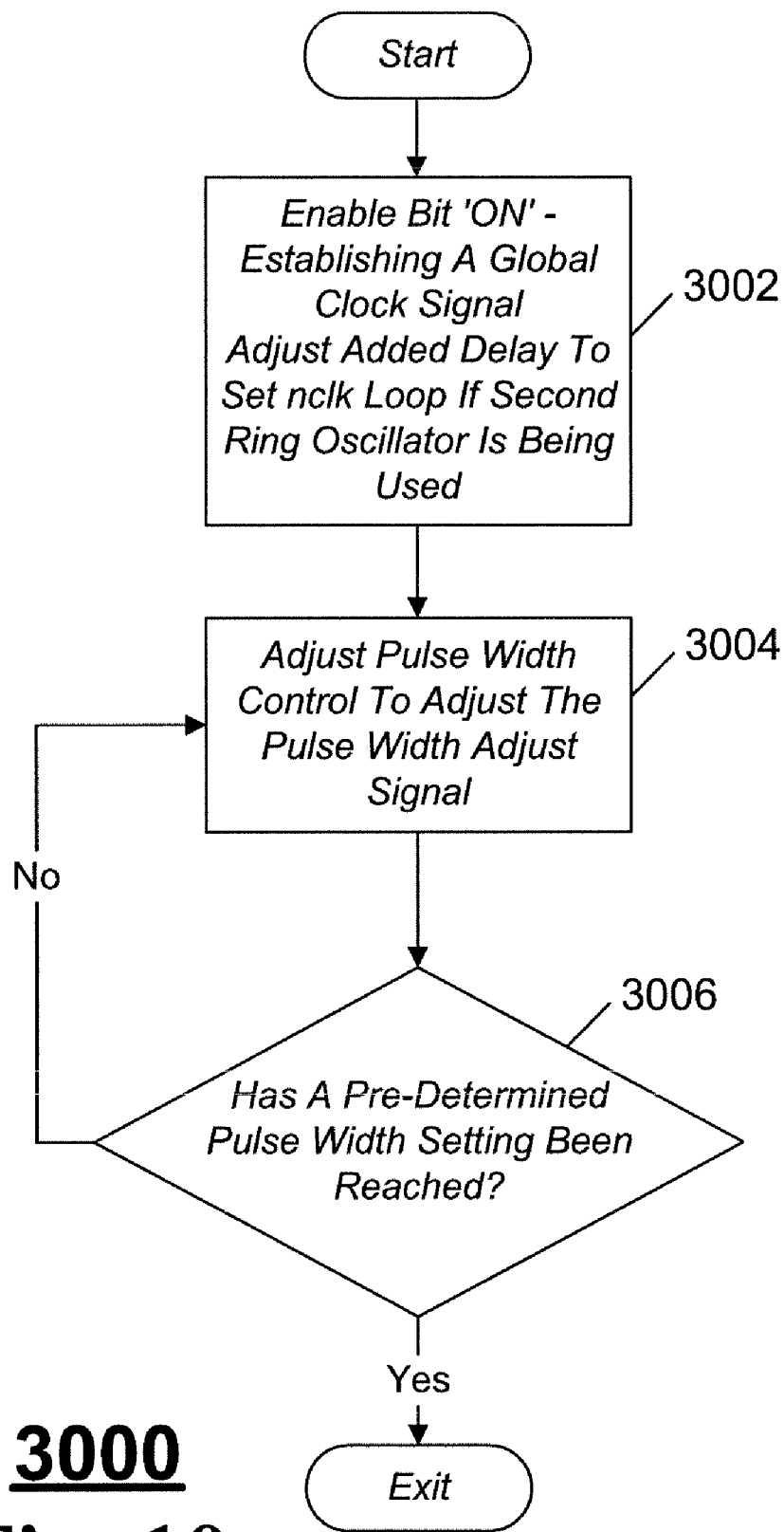
FIG. 10 illustrates one example of a routine 3000 for precisely tuning the pulse width of a pulse width adjusted signal to a predetermined pulse width.

Referring to FIG. 10 there is illustrated a routine 3000 for precisely tuning the pulse width of a pulse width adjusted signal to a predetermined pulse width. In addition, in an exemplary embodiment for correct operation of the local clock buffer 200 and the functional circuitry operationally connect to the local clock buffer 200 the pulse width of the output signal from the local clock buffer 200 needs to be accurately characterized. In this regard, for example and not limitation, a pulse width that is too short can cause the local clock buffer 200 to fail. As such, if the pulse width causes the LCB 200 to fail, the functional circuitry operationally coupled to the LCB 200 will not work correctly. In addition, if the functional circuitry requires and does not receive a precisely tuned pulse width output from LCB 200 the functional circuitry may not operate correctly. Processing begins in block 3002.

In block 3002 an enabled bit is set 'ON' allowing the circuit to operate and establishing a global clock signal 102. The global clock signal 102 can originate from a functional block in the semiconductor, and or be self generated by implementing a second ring oscillator 304. The second ring oscillator 304 can also be referred to as the nclk loop. The global clock signal 102 servers as the input clock to the LCB 200. Processing then moves to block 3004.

In block 3004 the pulse with of the pulse width adjusted signal from clock out 112 is adjusted by adjusting the pulse width controller 206. Such adjustment to the pulse width controller 206 includes increasing and or decreasing the pulse width of the pulse width adjusted signal output from clock output 112. Processing then moves to decision block 3006.

In decision block 3006 a determination is made as to whether or not a predetermined pulse width setting has been reached. If the resultant is in the affirmative that is a predetermined pulse width setting has been reached then the routine is exited. If the resultant is in the negative that is a predetermined pulse width setting has not been reached then processing returns to block 3004.

Figure 11:
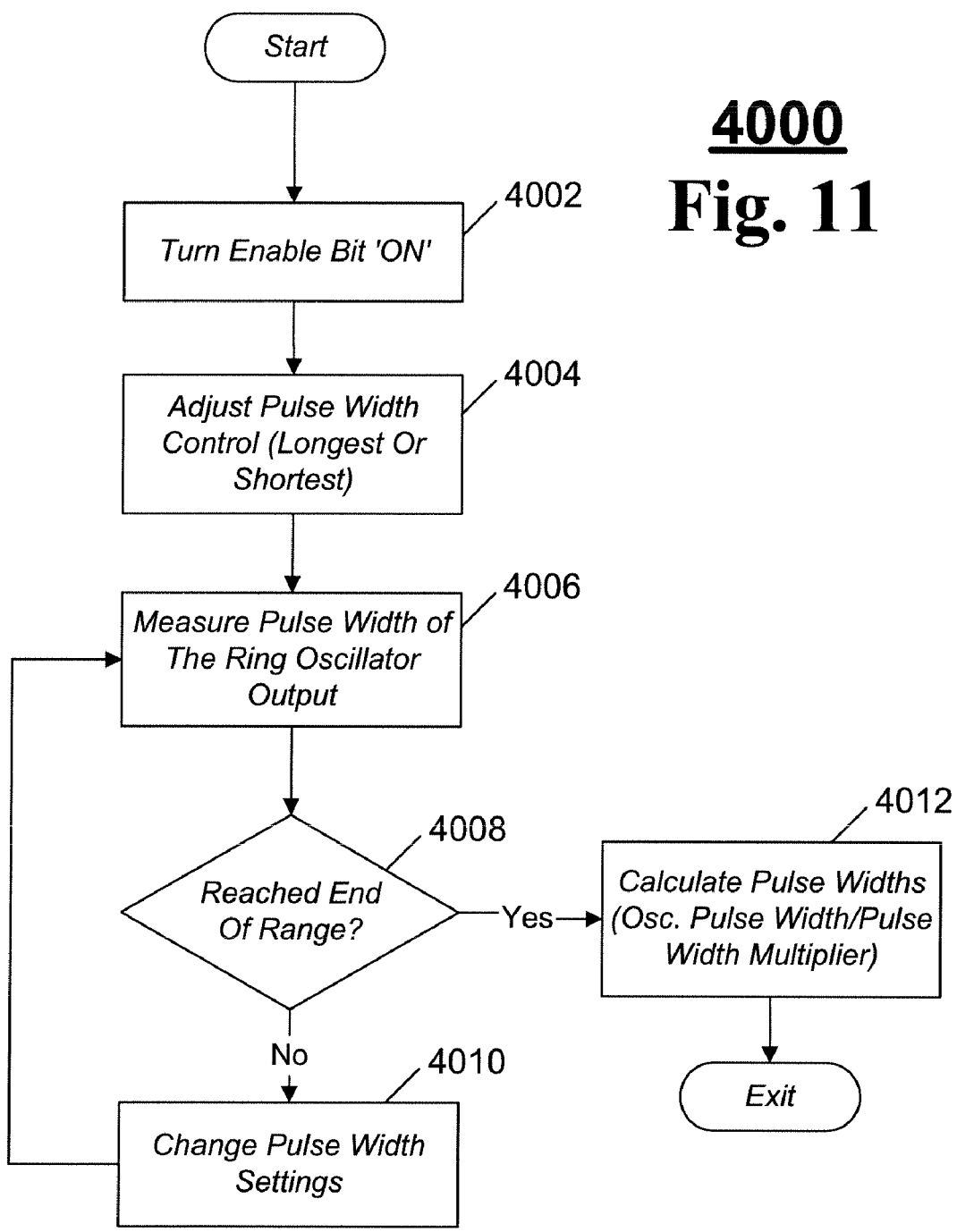
FIG. 11 illustrates one example of a routine 4000 for multiplying a pulse width adjusted signal effectuating the ability to directly measure the pulse width of the pulse width adjusted signal.

Referring to FIG. 11 there is illustrated one example of a routine 4000 for multiplying a pulse width adjusted signal effectuating the ability to directly measure the pulse width of the pulse width adjusted signal. In an exemplary embodiment of the present invention the pulse width of the pulse width adjusted signal from output clock 112 can be directly measured by implementing a pulse width multiplier. One example is illustrated in FIG. 7.

Since the speed of the global clock signal 102 is typically so fast that traditional test and measurement equipment may not adequately capture and measure the particulars of the global clock signal 102 waveform. As such, prior art methods of trying to observe the pulse width of such high-speed signals typically involved a relative measurement. Such relative measurement was done by taking a frequency 'A' and a frequency 'B', subtracting 'B' from 'A' and dividing by the number of divisions required to take the output.

In contrast an embodiment of the present invention utilizes a pulse width multiplier, which allows the pulse width to be multiplied by a series of gates such that the pulse width can be directly measured. Routine 4000 establishes a global clock signal input, adjusts the pulse width of the pulse width adjustable signal output from the output clock 112, and uses the output clock 112 signal as input to the pulse width multiplier 110. In this regard, the pulse width of the pulse width adjustable signal output from the output clock 112 can be directly observed, tested, and or measured. Processing begins in block 4002.

In block 4002 an enable bit is set 'ON' allowing the circuit to operate and a global clock signal 102 is established. The global clock signal 102 can originate from a functional block in the semiconductor, and or be self generated by implementing a second ring oscillator 304. The second ring oscillator 304 can also be referred to as the nclk loop. The global clock signal 102 servers as the input clock to the LCB 200. Processing then moves to block 4004.

In block 4004 the pulse with of the pulse width adjusted signal output from clock out 112 is adjusted by adjusting the pulse width controller 206. Such adjustment to the pulse width controller 206 includes increasing and or decreasing the pulse width of the pulse width adjusted signal output from clock output 112 to a longest or shortest setting. Processing then moves to block 4006.

In block 4006 the pulse width of the ring oscillator output is measured. Processing then moves to decision block 4008.

In block 4008 a determination is made as to whether or not the end of range has been reached. If the resultant is in the affirmative that is the end of range has been reached then processing moves to block 4012. If the resultant is in the negative that is the end of range has not been reached then processing moves to block 4010.

In block 4010 the pulse width settings can be changes. Processing then moves back to block 4006.

In block 4012 processing calculates the pulse widths of the oscillator pulse width and or pulse width multiplier.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of pulse width adjusting a local clock buffer (LCB), said method comprising:
    fabricating a local clock buffer in a semiconductor;
    receiving a global clock signal as input to said local clock buffer;
    implementing a pulse width controller operationally coupled to said local clock buffer and an output driver forming a ring oscillator, said output driver outputs a pulse width adjusted signal;
    adjusting said pulse width controller to change the pulse width of said pulse width adjusted signal, said pulse width adjusted signal is related in frequency to said global clock signal;
    adjusting said pulse width controller effectuating the shortening of the pulse width of said pulse width adjusted signal, until said local clock buffer fails in order to determine operational perfomance of said local clock buffer.

2. The method in accordance with claim 1, wherein said local clock buffer further comprising a clock control circuit, and a base block circuit.

3. The method in accordance with claim 1, further comprising:
    calibrating said local clock buffer by adjusting said pulse width controller to precisely tune said pulse width adjusted signal to a predetermined pulse width.

4. The method in accordance with claim 1, further comprising:
    generating said global clock signal by way of implementing an added delay operationally coupled to said local clock buffer and said output driver forming a second ring oscillator, said second ring oscillator outputs said global clock signal.

5. The method in accordance with claim 4, further comprising:
    adjusting said added delay to change said global clock signal frequency.

6. The method in accordance with claim 1, further comprising:
    implementing a pulse width multiplier operationally coupled to said pulse width controller, wherein the pulse width of said pulse width adjusted signal is multiplied effectuating the ability to directly measure the pulse width of said pulse width adjusted signal.

* * * * *